United States Patent
Rushkin et al.

(10) Patent No.: US 11,878,935 B1
(45) Date of Patent: Jan. 23, 2024

(54) METHOD OF COATING A SUPERSTRATE

(71) Applicant: CANON KABUSHIKI KAISHA, Tokyo (JP)

(72) Inventors: Ilya L. Rushkin, Austin, TX (US); Weijun Liu, Cedar Park, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/146,915

(22) Filed: Dec. 27, 2022

(51) Int. Cl.
*C03C 17/32* (2006.01)
*B05D 1/00* (2006.01)

(52) U.S. Cl.
CPC ............. *C03C 17/32* (2013.01); *B05D 1/005* (2013.01); *C03C 2218/116* (2013.01)

(58) Field of Classification Search
CPC .... C03C 17/32; C03C 2218/116; B05D 1/005
See application file for complete search history.

(56) References Cited

U.S. PATENT DOCUMENTS

| | | | |
|---|---|---|---|
| 5,966,635 A * | 10/1999 | Hiatt | B08B 3/10 438/795 |
| 8,257,904 B2 | 9/2012 | Motoike | |
| 8,815,476 B2 | 8/2014 | Takashi | |
| 2004/0009428 A1* | 1/2004 | Tamura | G03F 7/0047 430/311 |
| 2014/0178646 A1* | 6/2014 | Wolk | B32B 3/263 428/161 |
| 2021/0070906 A1* | 3/2021 | Li | C08F 224/00 |
| 2021/0305082 A1* | 9/2021 | Wan | H01L 21/6715 |

FOREIGN PATENT DOCUMENTS

JP 5542413 B2 7/2014

OTHER PUBLICATIONS

D.P. Birnie et al, Optical Engineering 31(9), 2012-2020 (Sep. 1992).
(Continued)

*Primary Examiner* — James M Mellott
(74) *Attorney, Agent, or Firm* — Abel Schillinger, LLP

(57) ABSTRACT

A method of coating a superstrate using a vacuum chuck containing ridges can comprise attaching the superstrate on the vacuum chuck; applying on the superstrate a liquid layer of a coating composition, the coating composition comprising a coating agent and a non-fluorinated solvent, wherein the non-fluorinated solvent has a boiling point of at least 165° C.; and solidifying the coating composition to form a solid coating layer. The material of the superstrate can have a thermal conductivity of not greater than 10 W/mK and the solid coating layer obtained after solidifying may comprise a smoothness value (SM) of not greater than 1%, the smoothness value being defined as $SM=(C_{RD}/C_T)\times 100\%$, with $C_{RD}$ being a maximum roughness depth of the coating layer and $C_T$ an average thickness of the coating layer over a length of 10 mm of the solid coating layer.

15 Claims, 4 Drawing Sheets

(56) References Cited

OTHER PUBLICATIONS

Cohen, Edward; Lightfoot, E. J. (2011), "Coating Processes", Kirk-Othmer Encyclopedia of Chemical Technology, New York: John Wiley., 68 pages.
Scriven, L. E. (1988). "Physics and Applications of DIP Coating and Spin Coating". MRS Proceedings. Cambridge University Press (CUP). 121: 717-729.
Emslie, A. G.; Bonner, F. T.; Peck, L. G. (1958). "Flow of a viscous liquid on a rotating disk". J. Appl. Phys. 29 (5): 858-862.
Wilson, S. K.; Hunt, R.; Duffy, B. R. (2000). "The rate of spreading in spin coating". J. Fluid Mech. 413 (1): 65-88.
Danglad-Flores, J.; Eickelmann, S.; Riegler, H.: "Deposition of polymer films by spin casting: A quantitative analysis". Chem. Engineering Science, 179 (2018) 257-264.

\* cited by examiner

METHOD OF COATING A SUPERSTRATE

FIELD OF THE DISCLOSURE

The present disclosure relates to a method of coating a superstrate having a low thermal conductivity by applying a solid coating layer having a high smoothness.

BACKGROUND

Inkjet Adaptive Planarization (IAP) requires the use of a superstrate with a high flatness and a specific surface characteristic. In order to achieve a desired flatness and desired surface properties, a coating layer is typically applied on the superstrate by spin-coating using a vacuum chuck. However, especially if the superstrate is made of a material having a low thermal conductivity, it is known that applying a coating layer with high flatness can be challenging and large thickness variation mimicking the ridges of the vacuum chuck design are observed. There exists a need to improve methods involving spin-coating for producing smooth coating layers on low-thermally conductive superstrates with a high efficiency.

SUMMARY

In one embodiment, a method of coating a superstrate can comprise: attaching a superstrate on a vacuum chuck, wherein the superstrate comprises a first surface and a second surface, the first surface and the second surface being opposite to each other, and the first surface directly facing the vacuum chuck; applying on the second surface of the superstrate a liquid layer of a coating composition, the coating composition comprising a coating agent and a non-fluorinated solvent, wherein the non-fluorinated solvent can have a boiling point of at least 165° C.; and solidifying the coating composition to form a solid coating layer, wherein a material of the superstrate can have a thermal conductivity of not greater than 10 W/mK; the vacuum chuck comprises ridges for applying a vacuum to the superstrate during coating; and the solid coating layer obtained after solidifying comprises a smoothness value (SM) of not greater than 1%, the smoothness value being defined as SM=($C_{RD}/C_T$)×100%, with $C_{RD}$ being a maximum roughness depth of the coating layer and $C_T$ an average thickness of the coating layer over a length of 10 mm of the solid coating layer.

In another aspect of the method, the material of the superstrate can comprises a glass or fused silica.

In a further embodiment of the method, the boiling point of the solvent can be at least 175° C.

In a further aspect of the method, the non-fluorinated solvent of the coating composition can include ethyl acetoacetate.

In yet another aspect of the method, the coating agent of the coating composition can comprise at least one polymer. In a particular aspect, the at least one polymer can include a polyacrylate. In a certain particular aspect, the polyacrylate may include poly(methyl methacrylate) and poly(methyl methacrylate-co-methacrylic acid).

In a further aspect, the coating agent of the coating composition of the method can comprise at least one polymerizable polymer and at least one cross-linking agent. In a particular aspect, the polymerizable polymer can include a fluoropolymer or an acrylate polymer.

In one embodiment of the method, the coating agent can further comprise a thermal acid generator.

In another embodiment of the method, the amount of the polymerizable polymer can be at least 80 wt % based on the total weight of the coating agent.

In another embodiment of the method, the amount of the coating agent in the coating composition can be at least 1 wt % and not greater than 35 wt % based on the total weight of the coating composition.

In one embodiment of the method, the amount of the non-fluorinated solvent in the coating composition can at least 60 wt % based on the total weight of the coating composition.

In one aspect of the method, the coating composition can have a viscosity of not greater than 50 mPa s at a temperature of 23° C.

In a further aspect of the method, applying the liquid coating layer of the coating composition on the second surface of the superstrate can include spin-coating.

In a certain aspect of the method, the vacuum chuck for attaching the superstrate can comprise at least 4 concentric ridges over a distance of at least 130 mm.

In one embodiment of the method, the formed solid coating layer can have a smoothness value of not greater than 0.8%.

In another embodiment of the method, the average thickness of the formed solid coating layer can be at least 0.08 microns and not greater than 2.5 microns.

In one aspect of the method, the superstrate can have a thermal conductivity of not greater than 2 W/mK.

In yet another aspect of the method, the vacuum for attaching the superstrate on the vacuum chuck can be at least 10 kPa and not greater than 90 kPa.

BRIEF DESCRIPTION OF THE DRAWINGS

Embodiments are illustrated by way of example and are not limited in the accompanying figure.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description is provided to assist in understanding the teachings disclosed herein and will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

The present disclosure is directed to a method of coating a superstrate having a thermal conductivity not greater than 10 W/mK using a vacuum chuck as assistance, and forming a solid coating layer of high smoothness.

Figure 1:
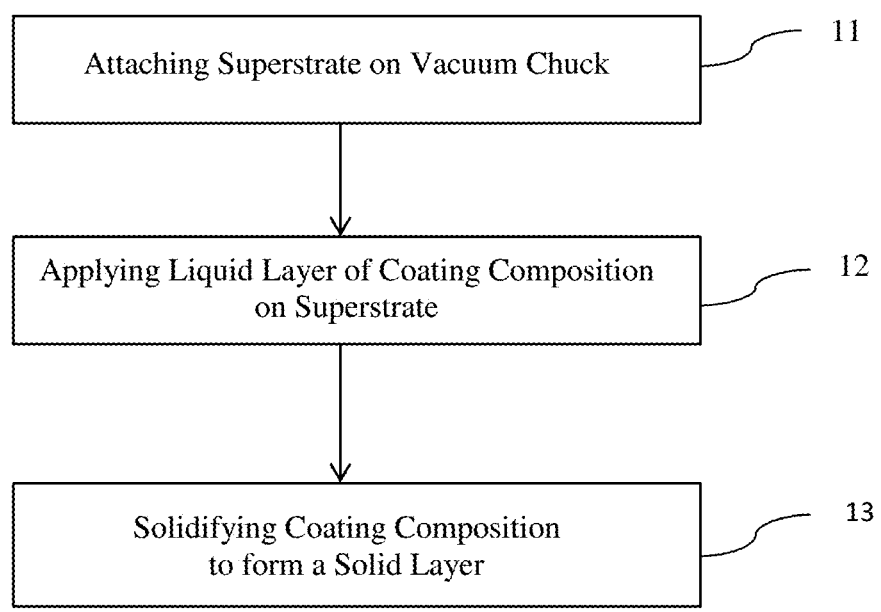
FIG. 1 includes a scheme describing a method of forming a superstrate according to one embodiment.

In one embodiment, as illustrated in FIG. 1, the method can comprise: (11) attaching the superstrate on a vacuum chuck; (12) applying a liquid layer of a coating composition on the superstrate, wherein the coating composition can comprise a coating agent and a non-fluorinated solvent, the non-fluorinated solvent having a boiling point of at least 165° C.; and (13) solidifying the coating composition to form a solid coating layer. In one aspect, the vacuum chuck can comprise ridges for applying vacuum to the superstrate during coating, and the solid coating layer obtained after solidifying can comprise a smoothness value (SM) of not greater than 1%, the smoothness value being defined as $SM=(C_{RD}/C_T)\times 100\%$, with $C_{RD}$ being a maximum roughness depth of the coating layer and $C_T$ an average thickness of the coating layer over a length of 10 mm of the solid coating layer.

In one embodiment, the material of the superstrate used for the applying the coating can have a thermal conductivity of not greater than 8 W/mK, or not greater than 5 W/mK, or not greater than 3 W/mK, or not greater than 1 W/mK, or not greater than 0.5 W/mK. In another aspect, the thermal conductivity of the material of the superstrate can be at least 0.5 W/mK, or at least 1 W/mK. Non-limiting examples of materials for the superstrate can be a glass-based material, silicon, a spinel, an organic polymer, a siloxane polymer, a fluorocarbon polymer, hardened sapphire, a deposited oxide, an organo-silane, an organosilicate material, inorganic polymers, or any combination thereof. The glass-based material can include fused silica, soda lime glass, borosilicate glass, alkali-barium silicate glass, quartz glass, or aluminosilicate glass.

In another embodiment, the vacuum chuck can comprise at least 3 concentric ridges over a distance of 130 mm, or at least 4 concentric ridges, or at least 5 concentric ridges or at least 6 concentric ridges, or at least 8 concentric ridges.

Figure 2A:
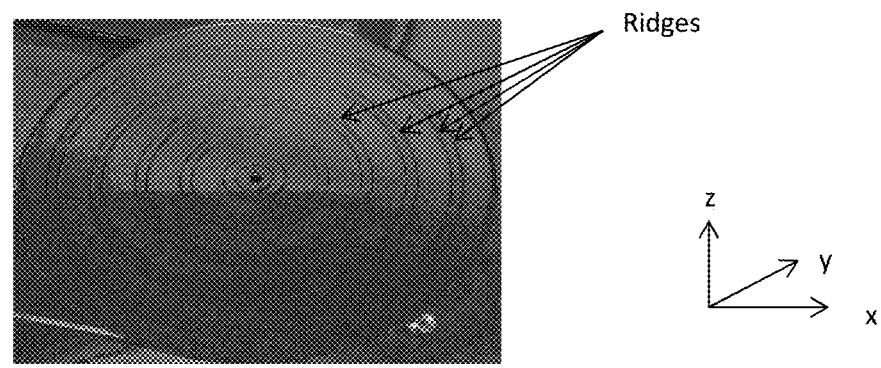
FIG. 2A includes a line-drawing illustrating a vacuum chuck comprising ridges.

As used herein and illustrated in FIG. 2A, a concentric ridge of the vacuum chuck is a small circular gap or opening having a defined width (WR).

Figure 2B:
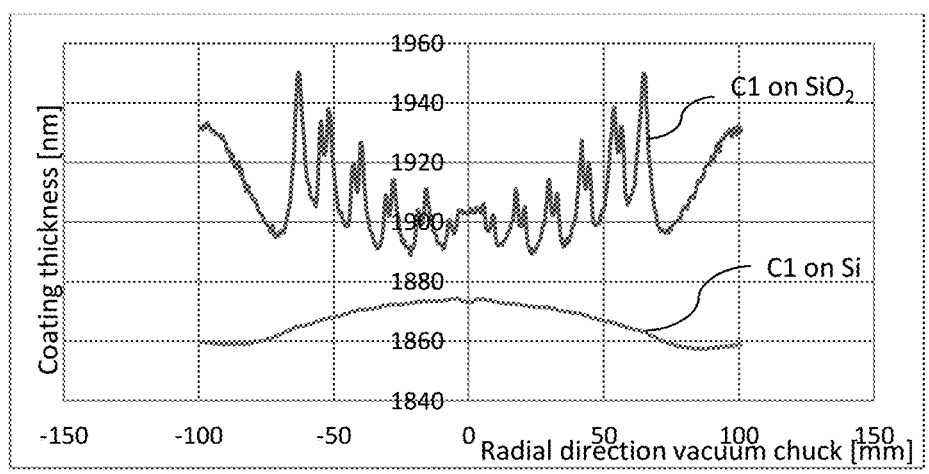
FIG. 2B includes a line drawing illustrating the coating thickness variation after coating a fused silica ($SiO_2$) superstrate and after coating a silicon superstrate using the vacuum chuck shown in FIG. 2A.
Figure 3:
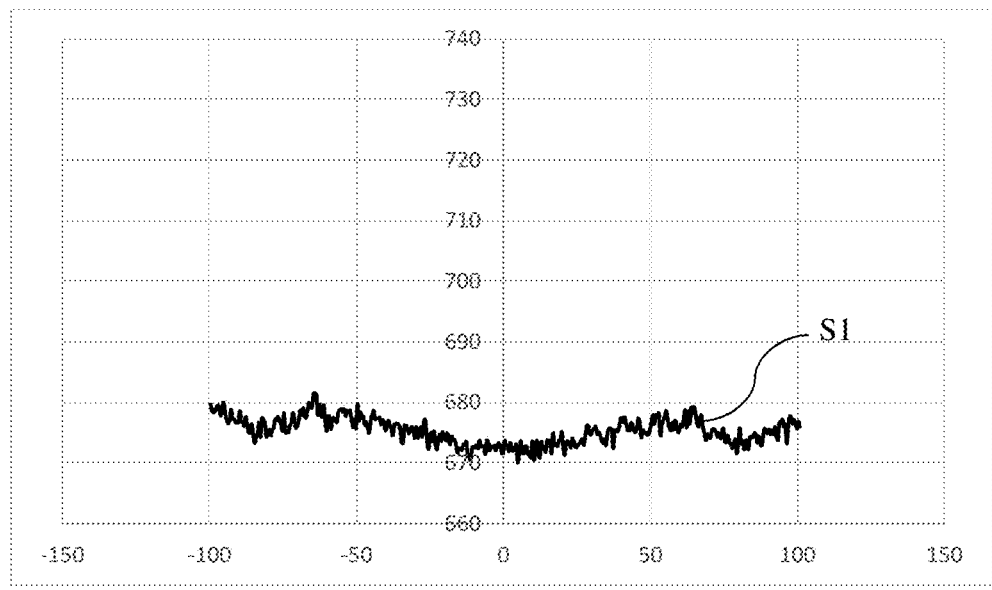
FIG. 3 includes a line drawing illustrating the coating thickness variation after coating a fused silica superstrate using the vacuum chuck shown in FIG. 2A according to one embodiment.

It has been observed that changing the material of the superstrate from silicon to a material having a low thermal conductivity, for example a glass, can lead to large differences in the coating quality when conducting spin-coating. As illustrated in FIG. 2B, a solid coating layer formed from a PMMA containing coating composition applied on a silicon superstrate can have after curing a very good smoothness with only minor thickness variation, as desired for AIP manufacturing, while the same coating composition applied on a fused silica superstrate may have a large thickness variation, and is mimicking the pattern of the ridges of the underlying vacuum chuck. It has been surprisingly found that changing the solvent of the coating composition to a solvent having a boiling point of at least 165° C. at 1 atm can avoid the unwanted thickness variations and allow forming of smooth coating layers. Not being bound to theory, it is assumed that temperature variations throughout the superstrate may cause an uneven evaporation of the solvent from the liquid coating layer. Regions of the superstrate which are not in direct connection with the vacuum chuck, such as regions overlying the ridges of the vacuum chuck, may be of lower temperature and thereby causing a lower amount of evaporation. By using a solvent in the coating composition which is less temperature sensitive in its evaporation behavior a more even coating thickness can be achieved, without showing the pattern of the chuck in its thickness profile. Such non-limiting examples of solid coating layers formed by spin-coating can be seen in FIG. 3 and FIG. 4, as further discussed in the examples.

In one aspect, the vacuum applied by the vacuum chuck can be at least at least 1 kPa, or at least 10 kPa, or at least 20 kPa, or at least 40 kPa, or at least 60 kPa, or at least 70 kPa. In another aspect, the vacuum may be not greater than 100 kPa, or not greater than 90 kPa.

In another aspect, the width (WR) of the concentric ridges of the vacuum chuck can be at least 0.5 mm, or at least 1 mm, or at least 2 mm. In another aspect, the width of the ridges may be not greater than 5 mm microns, or not greater than 4 mm, or not greater than 3 mm.

In another embodiment, the coating agent of the coating composition can comprise at least one polymer. In a non-limiting embodiment, the at least one polymer can be a polyacrylate, or a polyvinylpyrrolidone, a novolac, a polyvinyl alcohol, or a polyvinylidene fluoride, or a polyimide, or polythiophene, or a polysilicone, or any combination thereof.

In a particular aspect, the at least one polymer of the coating agent can include a poly(methyl methacrylate). In a certain particular aspect, the at least one polymer can include the combination of two polymers, such as the combination of poly(methyl methacrylate) and poly(methyl methacrylate-co-methacrylic acid).

In another embodiment, the coating agent can comprise at least one polymerizable polymer and at least one cross-linking agent. In a certain aspect, the polymerizable polymer can include a fluoropolymer or an acrylate polymer.

In one aspect, the cross-linking agent of the coating agent can be a multi-functional compound capable of cross-linking the polymerizable polymer. In a non-limiting example, the polymerizable polymer can be a fluoropolymer and the cross-linking agent may be a triazine compound.

In another certain aspect, the coating agent can further include next to the polymerizable polymer and the cross-linking agent a thermal acid generator which can help to initiate the curing (cross-linking reaction).

In one aspect, the amount of the polymerizable polymer of the coating agent can be at least 50 wt % based on the total weight of the coating agent, or at least 60 wt %, or at least 70 wt %, or at least 80 wt %, or at least 90 wt %, or at least 95 wt %. In another aspect, the amount of the polymerizable polymer of the coating agent may be not greater than 99 wt %, or not greater than 98 wt %, or not greater than 97 wt % based on the total weight of the coating agent.

In another aspect, the coating agent can include at least one polymerizable monomer and/or at least one polymerizable oligomer, alone or on combination with the above-described polymerizable polymer. In certain aspects, the coating agent can further include at least one photoinitiator and/or at least one thermal curing agent.

As used herein, the term coating agent includes all ingredients which participate in forming the solid coating layer, such as at the least one film-forming polymer, or the combination of polymerizable polymer, cross-linking agent and curing agent (photoinitiator or thermal acid generator).

In one embodiment, the amount of the coating agent can be at least 1 wt % based on the total weight of the coating composition, or at least 5 wt %, or at least 10 wt %, or at least 15 wt %, or at least 20 wt %, or at least 25 wt %. In another aspect, the amount of the coating agent may be not greater than 30 wt %, or not greater than 25 wt %, or not greater than 22 wt %.

In another embodiment, the amount of the non-fluorinated solvent of the coating composition can be at least 70 wt % based on the total weight of the coating composition, or at least 75 wt %, or at least 80 wt %, or at least 85 wt %, or at least 90 wt %. In another aspect, the amount of the non-fluorinated solvent may be not greater than 99 wt %, or not greater than 95 wt %, or not greater than 90 wt %.

It has been surprisingly observed that by selecting a solvent which has a boiling point of at least 165° C. at 1 atm, unwanted side-effects caused by the ridges of the vacuum chuck can be avoided, and the final coating layer can have a smooth coating surface, without showing a pattern of the underlying concentric ridges in its thickness variation.

As used herein, non-fluorinated solvent means a solvent which does not contain fluorine in the molecule structure.

In one embodiment the boiling point at 1 atm of the non-fluorinated solvent can be at least 170° C., or at least 175° C., or at least 180° C. In another aspect, the boiling point at 1 atm may be not greater than 280° C., or not greater than 250° C., or not greater than 220° C., or not greater than 200° C.

Examples of non-fluorinated solvents can be ethyl acetoacetate, triethylene glycol dimethyl ether, ethylene glycol diacetate, dipropylene glycol methyl ether acetate, dimethyl phthalate, or any combination thereof. In a particular non-limiting aspect, the non-fluorinated solvent can be ethyl acetoacetate.

In certain aspects, the smoothness value (SM) of the formed solid coating layer may be not greater than 0.95, or not greater than 0.90, or not greater than 0.85, or not greater than 0.80, or not greater than 0.75.

In another embodiment, the viscosity at 23° C. of the coating composition can be not greater than 100 mPa s, or not greater than 50 mPa s, or not greater than 40 mPa s, or not greater than 30 mPa s, or not greater than 25 mPa s, or not greater than 20 mPa s, or not greater than 15 mPa s, or not greater than 12 mPa s, or not greater than 10 mPa s. In another aspect, the coating composition can have a viscosity of at least 2 mPa s, or at least 4 mPa s, or at least 6 mPa s. As used herein, the viscosities relate to Brookfield viscosities, measured with a Brookfield viscometer at 23° C.

After applying the coating composition, the solvent can be removed by drying. In other aspects, drying can be conducted on a hot-plate, or in an oven, or via IR-radiation.

In another embodiment, the amount of the coating composition applied onto the superstrate can be adjusted that a thickness of the formed solid coating layer can be at least 0.08 microns and not greater than 2.5 microns. In one aspect, the thickness of the coating layer can be at least 0.1 micron, or at least 0.3 microns, or at least 0.5 microns, or at least 0.8 microns, or at least 1 micron, or at least 1.5 micron, or at least 2 microns. In another aspect, the thickness of the solid coating layer may be not greater than 2.5 microns, or not greater than 2.0 microns, or not greater than 1.5 microns. The thickness of the solid coating layer can be a value between any of the minimum and maximum values noted above.

Figure 5:
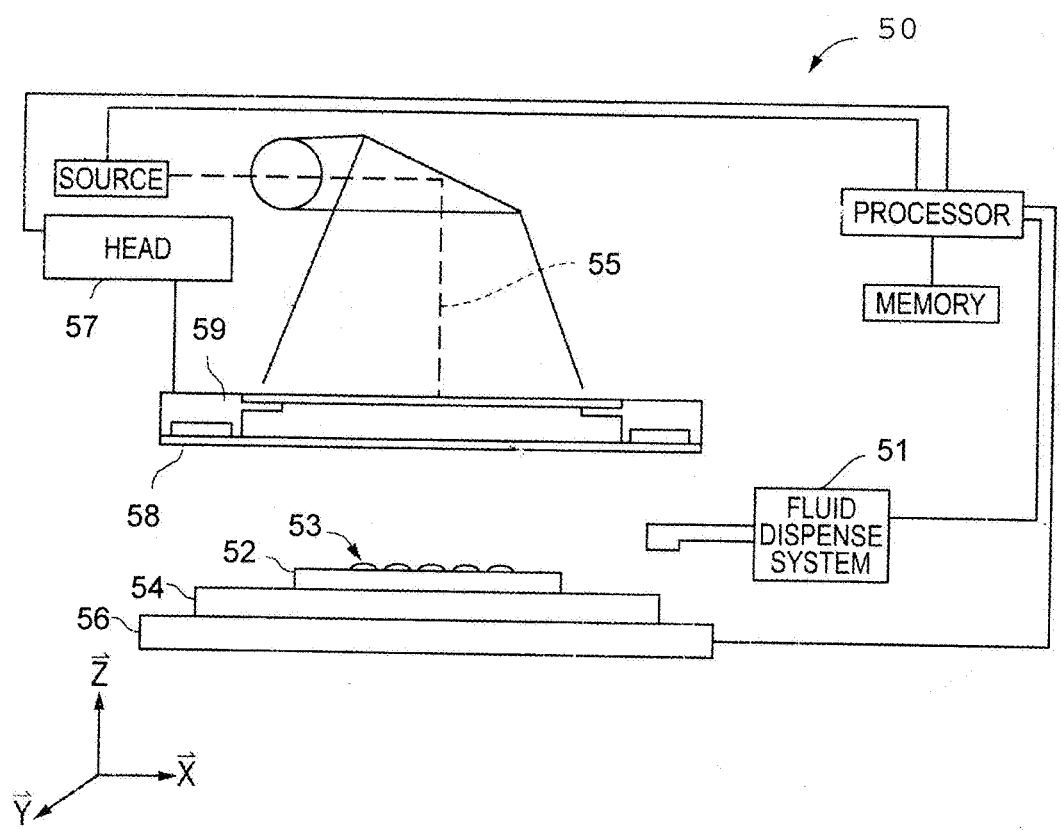
FIG. 5 includes a line drawing of an apparatus including a coated superstrate according to one embodiment.

Referring to FIG. 5, an apparatus (50) in accordance with an embodiment described herein can be used to planarize a substrate (52) using a superstrate (58) of the present disclosure containing a solid coating layer having a smoothness value of not greater than 1%. The superstrate (58) can be positioned spaced-apart from the substrate (52).

The substrate (52) may be a semiconductor base material, such as a silicon wafer, but may include an insulating base material, such as glass, sapphire, spinel, or the like. The substrate (52) may be coupled to a substrate holder (54), for example, to a chuck. The chuck may be any chuck including vacuum, pin-type, groove-type, electrostatic, electromagnetic, or the like. The substrate (52) and substrate holder (54) may be further supported by a stage (56). The stage (56) may provide translating or rotational motion along the X-, Y-, or Z-directions.

The superstrate (58) can be used to planarize a formable material deposited on a substrate (52). The superstrate (58) can be coupled to a superstrate holder (59). The superstrate (58) may be both held by and its shape modulated by the superstrate holder (59). The superstrate holder (59) may be configured to hold the superstrate (58) within a chucking region. The superstrate holder (59) can be configured as vacuum, pin-type, groove-type, electrostatic, electromagnetic, or another similar holder type. In one embodiment, the superstrate holder (59) can include a transparent window within the body of the superstrate holder (59).

The apparatus (50) can further include a fluid dispense system (51) for depositing a formable material (53) on the surface of the substrate (52). The formable material (53) can be positioned on the substrate (52) in one or more layers using techniques such as droplet dispense, spin-coating, dip coating, chemical vapor deposition (CVD), physical vapor deposition (PVD), thin film deposition, thick film deposition, or combinations thereof. The formable material (53) can be dispensed upon the substrate (52) before or after a desired volume is defined between the superstrate (58) and the substrate (52). The formable material (53) can include one or more polymerizable monomers and/or oligomers and/or polymers that can be cured using actinic radiation and/or heat.

The present disclosure is further directed to a method of manufacturing an article. The method can comprise applying a layer of a formable material on a substrate; bringing the layer of the formable material into contact with the superstrate of the present disclosure; and curing the formable material with light or heat to form a cured layer. The substrate and the cured layer may be subjected to additional processing to form a desired article, for example, by including an etching process to transfer an image into the substrate that corresponds to the pattern in one or both of the solidified layer and/or patterned layers that are underneath the solidified layer. The substrate can be further subjected to known steps and processes for device (article) fabrication, including, for example, curing, oxidation, layer formation, deposition, doping, planarization, etching, formable material removal, dicing, bonding, and packaging, and the like. In a certain aspect, the substrate may be processed to produce a plurality of articles.

The solid coating layer may be further used as an interlayer insulating film of a semiconductor device, such as LSI, system LSI, DRAM, SDRAM, RDRAM, or D-RDRAM, or as a resist film used in a semiconductor manufacturing process.

EXAMPLES

The following non-limiting examples illustrate the concepts as described herein.

Example 1

A first series of coating compositions was prepared wherein the coating agent included one or two polymers and varying solvents. The following coating compositions were made:
  S1: solution of 16 wt % of the polymer combination polymethylmethacrylate/(1.5%) polymethacrylic acid copolymer (PMMA/1.5PMAA) in the solvent ethyl acetoacetate (from Sigma-Aldrich)
  S2: solution of 20 wt % or the polymer combination polymethylmethacrylate/(1.5%) polymethacrylic acid copolymer (PMMA/1.5PMAA) in ethyl acetoacetate (from Sigma-Aldrich)
  C1: solution of 20 wt % polymethacrylate in anisole (from Kayaku Advanced Materials);
  C2: solution of 11 wt % of the polymer combination polymethylmethacrylate/(8.5%) polymethacrylic acid copolymer (PMMA/8.5PMAA) in ethyl lactate (from Kayaku Advanced Materials).

In a second series of experiments, coating compositions were prepared using varying solvents and as coating agent the combination of three ingredients: a polymerizable polymer; a cross-linking agent; and a curing catalyst. Specifically, as polymerizable polymer was used 96 wt % Lumiflon L-916 (from AGC Inc.), which is a solvent soluble fluoropolymer. The cross-linking agent was 2.9 wt % of 2,4,6-tris[bis(methoxymethyl)amino]-1,3,5-triazine (from TCI America, Inc), and 0.96 wt % of K-PURE TAG-2678, which is a thermal curing catalyst. All weight % amounts relate to the total weight of the coating agent, herein also called "Lumifol/TBMA-triazine/K-PURE." The following coating compositions were made using Lumifol/TBMA-triazine/K-PURE as curing agent, with varying solvents:
  S3: solution of 31.0 wt % Lumifol/TBMA-triazine/K-PURE in ethyl acetoacetate;
  S4: solution of 23.7 wt % Lumifol/TBMA-triazine/K-PURE in ethyl acetoacetate;
  C3: solution of 19.8 wt % Lumifol/TBMA-triazine/K-PURE in propylene glycol methyl ether acetate (PGMEA).

A main difference between compositions S1-S4 and comparative composition C1-C3 was the selection of the solvent: while the solvent of compositions S1-S4 was ethyl acetoacetate having a boiling point above 181° C., the boiling point of the comparative compositions was lower than 165° C., such as 154° C. for anisole, 154° C. for ethyl lactate, and 146° C. for PGMEA.

The coating compositions S2, C2, S4 and C3 were applied via spin-coating on a 150 mm diameter fused silica wafer having a thickness of 0.5 mm (from WaferPro), which was attached on a low contact vacuum chuck having 5 concentric ridges over the distance of 160 mm. The applied vacuum was 70 kPa. For the spin-coating, 3-4 ml of the respective coating composition was dispensed on the wafer rotated at a speed of 1350 rpm for 2 minutes followed at 2000 rpm for 5 minutes. The spin-coater used was a Model 300X coater from Cost Effective Equipment (CEE).

The coating compositions S1, C1 and S3 were applied via spin-coating on a 300 mm diameter fused silica wafer having a thickness of 0.7 mm (from Shin-etsu), which was attached on a low contact vacuum chuck having six double concentric ridges over the distance of about 155 mm. The applied vacuum was 50 kPa, for spin-coating 5.4 mL of the respective coatings composition was dispensed on the wafer rotated at a speed of 1350 rpm for 2 min followed at 1750 rpm for 5 min. The spin coated was model ACT 12 from TEL corporation.

After the spin-coating, the wafers were baked for 90 seconds at 150° C. on a heating plate to solidify the liquid coating compositions.

The thickness uniformity of the solid coating layer was analyzed using an ellipsometer (Model M-2000 X-210 from G. A. Woolam Co, Inc). A smoothness value was calculated based on the maximum roughness depth over a length of 10 mm ($C_{RD}$) and the average thickness ($C_T$) of the solid layer according to the following equations: $SM=(C_{RD}/C_T)\times 100\%$.

A summary of the above-described coating compositions and the qualities of the formed solid coating layers with regard to evenness (smoothness) is shown in Tables 1 and 2. All coating layers formed with a coating composition containing a solvent with a boiling point below 160° C. showed the pattern of the ridges of the vacuum chuck ("pattern") and contained large thickness variations, indicated by a smoothness value greater than 1. In contrast, smooth solid coating layers with low thickness variations were obtained ("smooth") when using a solvent with higher boiling point, such as ethyl acetoacetate.

TABLE 1

| Sample | Coating Agent | Amount of Coating Agent [wt %] | Solvent | Maximum roughness depth $C_{RD}$ [nm] | Average Thickness $C_T$ [nm] | Smoothness Value SM [%] |
|---|---|---|---|---|---|---|
| S1 | PMMA/ 1.5 PMAA | 16 | Ethyl acetoacetate ($B_p$ = 181° C.) | 6.5 | 675 | 0.96 smooth |
| S2 | PMMA/ 1.5 PMAA | 20 | Ethyl acetoacetate ($B_p$ = 181° C.) | NA | NA | NA smooth |
| C1 | PMMA | 20 | Anisole ($B_p$ = 154° C.) | 55.0 | 1909 | 2.88 |
| C2 | PMMA/ 8.5 PMAA | 11 | Ethyl lactate ($B_p$ = 154° C.) | NA | NA | NA pattern |

TABLE 2

| Sample | Coating Agent | Amount of Coating Agent [wt %] | Solvent | Maximum roughness depth $C_{RD}$ [nm] | Average Thickness $C_T$ [nm] | Smoothness Value SM [%] |
|---|---|---|---|---|---|---|
| S3 | Lumifol/TBMA-triazine/K-PURE | 31 | Ethyl acetoacetate ($B_p$ = 181° C.) | 6.3 | 985 | 0.64 smooth |
| S4 | Lumifol/TBMA-triazine/K-PURE | 23.7 | Ethyl acetoacetate ($B_p$ = 181° C.) | NA | NA | NA smooth |
| C3 | Lumifol/TBMA-triazine/K-PURE | 19.8 | PGMEA ($B_p$ = 146° C.) | NA | NA | NA pattern |

An illustration of the thickness variation of the coating layer of comparative example C1 is shown in FIG. 2B. It can be seen that the coating layer had great thickness variations with a profile corresponding to the ridges of the underlying vacuum chuck used during spin-coating. These unwanted thickness variations could be avoided when changing the solvent of the composition. By using as solvent ethyl acetoacetate (sample S1) instead of anisole, a very smooth and even coating layer could be obtained, see FIG. 3.

Figure 4:
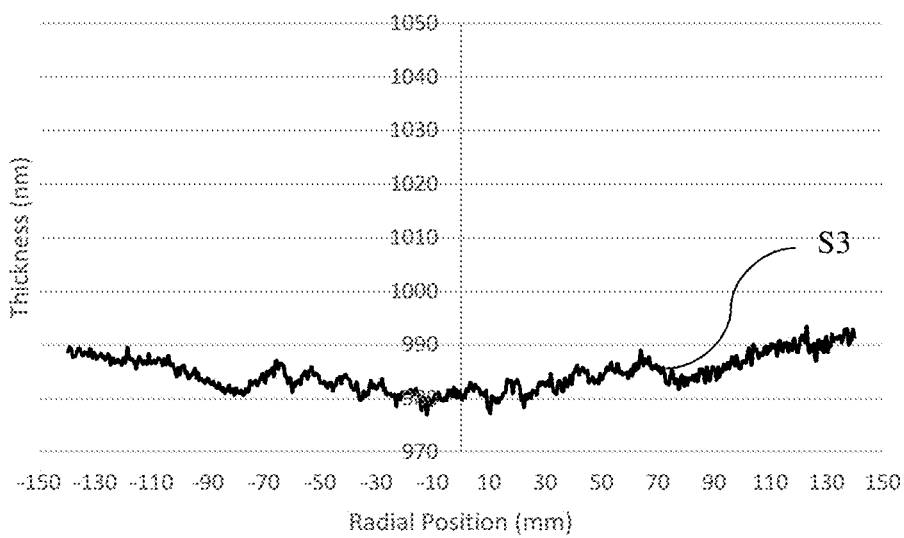
FIG. 4 includes a line drawing illustrating the coating thickness variation after coating a fused silica superstrate using the vacuum chuck shown in FIG. 2A according to one embodiment.

An example of a smooth coating layer formed by a coating agent including as coating agent the combination polymerizable fluoropolymer, cross-linking agent, and thermal curing catalyst, and solvent ethyl acetoacetate (sample S3) is shown in FIG. 4.

Not being bound to theory, it is assumed that because of a low thermal conductivity of the material of the fused silica wafer, at the regions of the ridges of the vacuum chuck where the wafer is not directly in connection to the material surface of the vacuum chuck and held only by the vacuum, that such regions are areas where the solvent of the applied layer of the liquid coating composition evaporates at a lower degree than at areas where the wafer is in direct attachment to the superstrate. It was surprisingly observed that the effect of uneven vaporization can be compensated if a solvent with a higher boiling point is used, such as ethyl acetoacetate.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method of coating a superstrate, comprising:
    attaching a superstrate on a vacuum chuck, wherein the superstrate comprises a first surface and a second surface, the first surface and the second surface being opposite to each other, and the first surface directly facing the vacuum chuck;
    applying on the second surface of the superstrate a liquid layer of a coating composition, the coating composition comprising a coating agent and a non-fluorinated solvent, wherein the non-fluorinated solvent has a boiling point of at least 165° C.; and
    solidifying the coating composition to form a solid coating layer, wherein
        a material of the superstrate has a thermal conductivity of not greater than 10 W/mK;
        the vacuum chuck comprises ridges for applying a vacuum to the superstrate during coating; and
        the solid coating layer obtained after solidifying comprises a smoothness value (SM) of not greater than 1%, the smoothness value being defined as SM= $(C_{RD}/C_T) \times 100\%$, with $C_{RD}$ being a maximum roughness depth of the coating layer and $C_T$ being an average thickness of the coating layer over a length of 10 mm of the solid coating layer,
    wherein the coating comprises at least one polymerizable polymer, at least one cross-linking agent, and a thermal acid generator.

2. The method of claim 1, wherein the material of the superstrate comprises a glass or a fused silica.

3. The method of claim 1, wherein the boiling point of the solvent is at least 175° C.

4. The method of claim 1, wherein the non-fluorinated solvent includes ethyl acetoacetate.

5. The method of claim 1, wherein the polymerizable polymer includes a fluoropolymer or an acrylate polymer.

6. The method of claim 1, wherein an amount of the polymerizable polymer is at least 80 wt % based on the total weight of the coating agent.

7. The method of claim 1, wherein an amount of the coating agent in the coating composition is at least 1 wt % and not greater than 35 wt % based on the total weight of the coating composition.

8. The method of claim 1, wherein an amount of the non-fluorinated solvent in the coating composition is at least 60 wt % based on the total weight of the coating composition.

9. The method of claim 1, wherein the coating composition has a viscosity of not greater than 50 mPa s at a temperature of 23° C.

10. The method of claim 1, wherein applying the coating composition includes spin-coating.

11. The method of claim 1, wherein the vacuum chuck comprises at least 4 concentric ridges over a distance of at least 130 mm.

12. The method of claim 1, wherein the smoothness value is not greater than 0.8%.

13. The method of claim 1, wherein an average thickness of the solid coating layer is at least 0.08 microns and not greater than 2.5 microns.

14. The method of claim 1, wherein the superstrate has a thermal conductivity of not greater than 2 W/mK.

15. The method of claim 1, wherein the vacuum for attaching the superstrate on the vacuum chuck is at least 10 kPa and not greater than 90 kPa.

* * * * *